(12) United States Patent
Hojo et al.

(10) Patent No.: US 9,603,262 B2
(45) Date of Patent: Mar. 21, 2017

(54) ELECTRONIC COMPONENT MOUNTING APPARATUS AND METHOD

(71) Applicant: Shinkawa Ltd., Tokyo (JP)

(72) Inventors: Koji Hojo, Tokyo (JP); Makoto Takahashi, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 0 days.

(21) Appl. No.: 14/871,622

(22) Filed: Sep. 30, 2015

(65) Prior Publication Data

US 2016/0029494 A1 Jan. 28, 2016

Related U.S. Application Data

(60) Division of application No. 13/691,976, filed on Dec. 3, 2012, now abandoned, which is a continuation of
(Continued)

(30) Foreign Application Priority Data

Jun. 4, 2010 (JP) .................................. 2010-128480

(51) Int. Cl.
*H01L 21/00* (2006.01)
*H05K 13/00* (2006.01)
(Continued)

(52) U.S. Cl.
CPC ...... *H05K 3/3494* (2013.01); *H01L 21/67011* (2013.01); *H01L 24/16* (2013.01);
(Continued)

(58) Field of Classification Search
None
See application file for complete search history.

(56) References Cited

U.S. PATENT DOCUMENTS 6,131,795 A 10/2000 Sato
6,543,669 B2 4/2003 Takahashi et al.
(Continued)

FOREIGN PATENT DOCUMENTS

JP 5-109840 4/1993
JP 2003-31993 1/2003
(Continued)

OTHER PUBLICATIONS

International Search Report dated Jul. 26, 2011, from corresponding International Application No. PCT/JP2011/062664.
(Continued)

*Primary Examiner* — Devang R Patel
(74) *Attorney, Agent, or Firm* — Katten Muchin Rosenman LLP

(57) ABSTRACT

An electronic component mounting apparatus includes a bonding tool for thermally bonding an electronic component onto a substrate, the bonding tool to be driven in a direction getting close to and from the substrate, a linear scale and a linear scale head detecting the position of the bonding tool in the direction getting close to and from the substrate, and a control unit configured to hold the position of the bonding tool in the direction getting close to and from the substrate when a solder film between an electrode of the electronic component and an electrode of the substrate is thermally fused when the bonding tool gets close to the substrate by a predetermined distance from a reference position while heating the electronic component. The electronic component mounting apparatus for bonding the electronic component and the substrate with thermally fusible bond metal offers an improvement in the bonding quality.

2 Claims, 6 Drawing Sheets

Related U.S. Application Data application No. PCT/JP2011/062664, filed on Jun. 2, 2011.

(51) Int. Cl.
*H05K 3/34* (2006.01)
*H01L 21/67* (2006.01)
*H01L 23/00* (2006.01)

(52) U.S. Cl.
CPC .............. *H01L 24/75* (2013.01); *H01L 24/81* (2013.01); *H01L 24/13* (2013.01); *H01L 2224/1134* (2013.01); *H01L 2224/131* (2013.01); *H01L 2224/13144* (2013.01); *H01L 2224/1601* (2013.01); *H01L 2224/75251* (2013.01); *H01L 2224/75252* (2013.01); *H01L 2224/75305* (2013.01); *H01L 2224/75502* (2013.01); *H01L 2224/75744* (2013.01); *H01L 2224/75753* (2013.01); *H01L 2224/75824* (2013.01); *H01L 2224/75901* (2013.01); *H01L 2224/81193* (2013.01); *H01L 2224/81204* (2013.01); *H01L 2224/81447* (2013.01); *H01L 2224/81815* (2013.01); *H01L 2924/01004* (2013.01); *H01L 2924/014* (2013.01); *H01L 2924/01005* (2013.01); *H01L 2924/01006* (2013.01); *H01L 2924/01029* (2013.01); *H01L 2924/01033* (2013.01); *H01L 2924/01079* (2013.01); *H01L 2924/12043* (2013.01); *H05K 3/3436* (2013.01); *H05K 2201/10674* (2013.01)

(56) References Cited

U.S. PATENT DOCUMENTS

| | | | |
|---|---|---|---|
| 6,706,130 | B1 | 3/2004 | Minamitani et al. |
| 7,296,727 | B2 | 11/2007 | Onobori et al. |
| 7,299,965 | B2 | 11/2007 | Sato |
| 7,513,284 | B2 | 4/2009 | Onituka |
| 7,748,112 | B2 * | 7/2010 | Hirata ............... H01L 21/67253 29/709 |
| 2002/0021450 | A1 | 2/2002 | Aoki |
| 2003/0160966 | A1 | 8/2003 | Osaki et al. |
| 2007/0144680 | A1 | 6/2007 | Kawada et al. |
| 2007/0215673 | A1 | 9/2007 | Yoshimoto et al. |
| 2009/0289098 | A1 | 11/2009 | Terada et al. |

FOREIGN PATENT DOCUMENTS

| | | |
|---|---|---|
| JP | 3399323 | 2/2003 |
| JP | 3399324 | 2/2003 |
| JP | 2007-173522 | 7/2007 |
| JP | 2008-130727 | 6/2008 |
| JP | 2008-251727 | 10/2008 |
| JP | 2009-277962 | 11/2009 |
| WO | 2007/066559 | 6/2007 |

OTHER PUBLICATIONS

U.S. Office Action dated Feb. 20, 2014 from corresponding U.S. Appl. No. 13/691,976.
U.S. Office Action dated Jun. 25, 2014 from corresponding U.S. Appl. No. 13/691,976.
U.S. Office Action dated Mar. 31, 2015 from corresponding U.S. Appl. No. 13/691,976.

\* cited by examiner

ELECTRONIC COMPONENT MOUNTING APPARATUS AND METHOD

TECHNICAL FIELD

The present invention relates to a structure of an electronic component mounting apparatus for mounting an electronic component on a substrate or the like, and also to a method therefor.

BACKGROUND ART

There are many techniques used for mounting an electronic component with a solder bump formed on an electrode on a substrate through thermal bonding. In these techniques, the electronic component is pressed against the substrate using a bonding tool and heated to melt the solder bump for solder bond onto an electrode of the substrate. In this thermal bonding process, continuous pressing after melting the solder bump can squash and deform the melted solder. To avoid deforming the solder bump, the position of the thermal bonding tool is fixed before melting the solder bump. However, even if the thermal bonding tool may be fixed, there is still deformation due to loading in a load cell for detecting a pressing force. Upon release of this residual deformation, the thermal bonding tool can move downward to squash and deform the melted solder bump.

There have hence been proposed techniques of bringing a thermal bonding tool to have a reduced pressing force before solder bump melting, using the thermal bonding tool to press an electronic component having a solder bump against a substrate, starting to heat the electronic component, and then if the pressing force becomes equal to or lower than a predetermined value, raising the thermal bonding tool based on the determination that the solder is melted (see Patent Documents 1 and 2, for example).

There has also been proposed a technique of, after starting to increase the temperature of an electronic component using a thermal bonding tool, bringing a head tool into constant control of a pressing force on the electronic component, detecting reduction in the loading measured using a load cell to determine that the solder is melted, and switching the operation of the head tool from the constant loading control to position control in which the height of a leading end of a suction nozzle is made positionally constant to reliably control the dorsal height of the electronic component even while the solder is melted (see Patent Document 3, for example).

RELATED ART DOCUMENTS

Patent Documents

Patent Document 1: Japanese Patent No. 3399323
Patent Document 2: Japanese Patent No. 3399324
Patent Document 3: Japanese Unexamined Patent Application Publication No. 2003-31993

SUMMARY OF THE INVENTION

Problems to be Solved by the Invention

Incidentally, gold-solder fusion bond has recently and frequently being used in which a gold bump is formed on an electrode of an electronic component, while a thin solder film is provided on the surface of a copper electrode of a substrate, and the gold bump and the solder are thermally fused and bonded. In this technique, the film formed on the surface of the substrate electrode has a small thickness of 10 to 30 μm. Applying this to the related arts disclosed in Patent Documents 1 to 3, the sink of the thermal bonding tool immediately after the loading decreases can be accordingly greater than the thickness of the solder film. This can cause the leading end of the gold bump formed on the electrode of the electronic component to come into contact with the surface of the copper electrode of the substrate during mounting of the electronic component. In this case, loading on the electronic component and/or the gold bump before raising the thermal bonding tool can damage the electronic component, and/or the contact between the gold bump and the copper electrode can cause the gold bump to be deformed and come into contact with an adjacent gold bump, resulting in poor bonding quality.

It is hence an object of the present invention to improve the quality of bonding in an electronic component mounting apparatus for bonding an electronic component and a substrate with thermally fusible bond metal.

Means for Solving the Problems

The present invention is directed to an electronic component mounting apparatus for mounting an electronic component on a substrate by bonding an electrode of the electronic component and an electrode of the substrate with thermally fusible bond metal, the apparatus including: a bonding tool for thermally bonding the electronic component onto the substrate, the bonding tool to be driven in a direction getting close to and away from the substrate; a drive unit for driving the bonding tool in the direction getting close to and away from the substrate; a position detection unit for detecting the position of the bonding tool in the direction getting close to and away from the substrate; and a control unit for changing the position of the bonding tool in the direction getting close to and away from the substrate with the drive unit, in which the control unit includes bonding tool position holding means for holding the position of the bonding tool in the direction getting close to and away from the substrate based on the determination that the bond metal between the electrode of the electronic component and the electrode of the substrate is thermally fused when the bonding tool gets close to the substrate by a predetermined distance from a reference position while heating the electronic component.

In the electronic component mounting apparatus according to the present invention, it is also preferable that the electronic component includes a bump formed on the electrode and the substrate includes a film of the bond metal formed on the electrode, and that the control unit further includes: contact detecting means for determining whether or not the bump and the film are in contact with each other based on a signal from the position detection unit; and reference position setting means for setting the position of the bonding tool with respect to the substrate as the reference position when the contact detecting means determines that the bump and the film are in contact with each other.

In the electronic component mounting apparatus according to the present invention, it is also preferable that the control unit further includes: second reference position setting means for setting the position of the bonding tool with respect to the substrate as a second reference position after the reference position setting means sets the reference position and when the distance of the bonding tool from the substrate in the direction getting close to and away from the substrate changes from increasing to decreasing; and second bonding tool position holding means for holding the position of the bonding tool in the direction getting close to and away from the substrate based on the determination that the bond metal between the electrode of the electronic component and the electrode of the substrate is thermally fused when the bonding tool gets close to the substrate by a second predetermined distance from the second reference position while heating the electronic component.

The present invention is also directed to an electronic component mounting method for mounting an electronic component on a substrate by bonding an electrode of the electronic component and an electrode of the substrate with thermally fusible bond metal, the method including: preparing an electronic component mounting apparatus including a bonding tool for thermally bonding the electronic component onto the substrate, the bonding tool to be driven in a direction getting close to and away from the substrate, a drive unit for driving the bonding tool in the direction getting close to and away from the substrate, and a position detection unit for detecting the position of the bonding tool in the direction getting close to and away from the substrate; and holding the position of the bonding tool in the direction getting close to and away from the substrate based on the determination that the bond metal between the electrode of the electronic component and the electrode of the substrate is thermally fused when the bonding tool gets close to the substrate by a predetermined distance from a reference position while heating the electronic component.

In the electronic component mounting method according to the present invention, it is also preferable that the electronic component includes a bump formed on the electrode and the substrate includes a film of the bond metal formed on the electrode, and the method further includes: determining whether or not the bump and the film are in contact with each other based on a signal from the position detection unit; and setting the position of the bonding tool with respect to the substrate as the reference position when it is determined in the step of determining that the bump and the film are in contact with each other.

In the electronic component mounting method according to the present invention, it is also preferable that the method further includes: setting the position of the bonding tool with respect to the substrate as a second reference position after the reference position is set in the step of setting and when the distance of the bonding tool from the substrate in the direction getting close to and away from the substrate changes from increasing to decreasing; and holding the position of the bonding tool in the direction getting close to and away from the substrate based on the determination that the bond metal between the electrode of the electronic component and the electrode of the substrate is thermally fused when the bonding tool gets close to the substrate by a second predetermined distance from the second reference position while heating the electronic component.

Advantage

The present invention offers the advantage of improving the quality of bonding in an electronic component mounting apparatus for bonding an electronic component and a substrate with thermally fusible bond metal.

MODES FOR CARRYING OUT THE INVENTION

Figure 1:
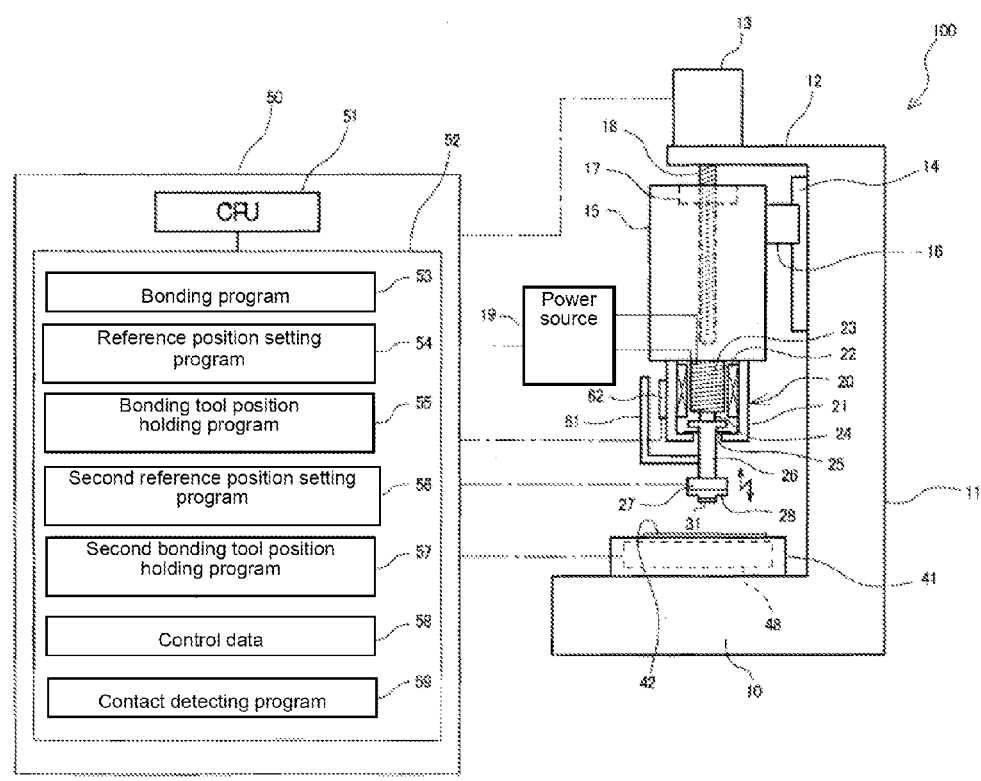
FIG. 1 is a system diagram showing the configuration of an electronic component mounting apparatus according to an exemplary embodiment of the present invention.

An exemplary embodiment of the present invention will hereinafter be described with reference to the accompanying drawings. As shown in FIG. 1, an electronic component mounting apparatus 100 according to the present invention is configured to include a base 10, a frame 11 extending upward from the base 10, an upper flange 12 extending from an upper portion of the frame 11, a guide 14 provided vertically on a side surface of the frame 11, a slider 16 attached vertically slidably to the guide 14, a rise-and-fall block 15 fixed to the slider 16 to be movable vertically with the slider 16, a nut 17 fixed to the rise-and-fall block 15, a feed screw 18 to be screwed into the nut 17, a motor 13 fixed to the upper flange 12 and configured to turn the feed screw 18, a voice coil motor 20 attached to a lower portion of the rise-and-fall block 15, a rod 26 to be moved vertically by the voice coil motor 20, a ceramic heater 27 attached at a leading end of the rod 26, a bonding tool 28 attached at the lower end of the ceramic heater 27 and configured to suck an electronic component 31, a bonding stage 41 for sucking and fixing a substrate 42 thereon, and a control unit 50. The motor 13 and the voice coil motor 20 constitute a drive unit for vertically driving the bonding tool 28.

The voice coil motor 20 is configured to include a casing 21, a permanent magnet stator 22 fixed along the inner periphery of the casing 21, and a movable coil 23 arranged inside the stator 22. The rod 26 is attached to the casing 21 via a plate spring 25. Also, an L-shaped linear scale 61 with a finely-scaled vertical portion is fixed to the rod 26. A linear scale head 62 for reading a pattern on the linear scale 61 is attached to the outer surface of the casing 21 in a manner facing toward the linear scale 61. The linear scale 61 and the linear scale head 62 constitute a position detection unit for detecting the position of the bonding tool 28 in the height direction. The coil 23 of the voice coil motor 20 is supplied with driving power from a power source 19. The bonding stage 41 incorporates a stage heater 48 for heating the substrate 42 sucked and fixed on the bonding stage 41.

The control unit 50 is a computer incorporating a CPU 51 for signal processing and a memory 52. The memory 52 stores a bonding program 53 for bonding control, control data 58, a reference position setting program 54, a bonding tool position holding program 55, a second reference position setting program 56, a second bonding tool position holding program 57, and a contact detecting program 59.

The motor 13 is connected to the control unit 50 and arranged such that the direction and angle of rotation are controlled with a command from the control unit 50. The power source 19 is also connected to the control unit 50 and arranged such that the current and voltage output to the coil 23 are altered with a command from the control unit 50. The ceramic heater 27 and the stage heater 48 are also connected to the control unit 50 and arranged such that the heating state is controlled with a command from the control unit 50.

Figure 2:
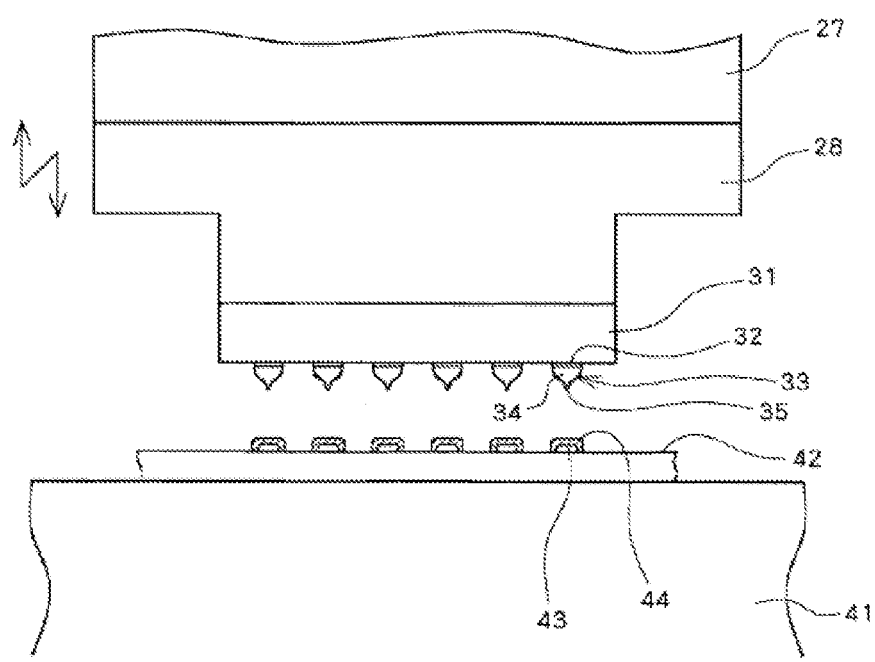
FIG. 2 is an illustrative view showing an electronic component and a substrate set in the electronic component mounting apparatus according to the exemplary embodiment of the present invention.

As shown in FIG. 2, the electronic component 31, which is sucked upside down at the leading end of the bonding tool 28, has multiple electrodes 32 provided on the surface thereof, and each gold bump 33 is formed on each of the electrodes 32. Each gold bump 33 has a disk-shaped base portion 34 on the side of the electrode 32 and a conical convex portion 35 protruding from the base portion 34. The substrate 42, which is sucked and fixed on the bonding stage 41, has copper electrodes 43 formed on the surface thereof, and a solder film 44 is formed on each of the copper electrodes 43. The solder film 44 has a very small thickness of about 10 to 30 μm. The electrode 32, the gold bump 33, and the copper electrode 43 of the substrate are arranged in a manner facing toward each other.

Figure 3:
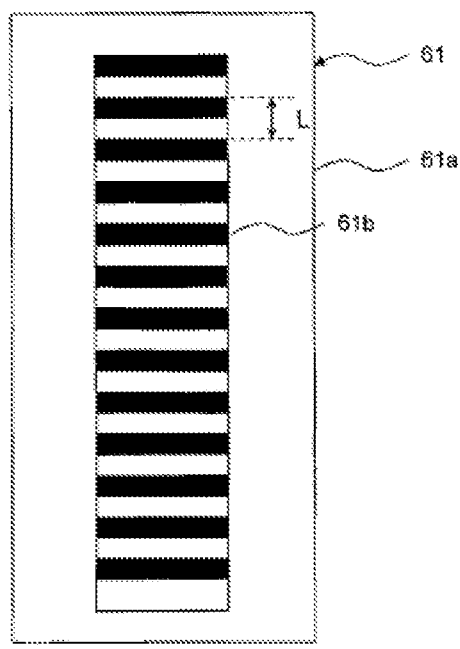
FIG. 3 is a schematic view showing a linear scale used in the electronic component mounting apparatus according to the exemplary embodiment of the present invention.

As shown in FIG. 3, the linear scale 61 includes a linear scale main body 61a on which a pattern 61b with a very fine pitch L is provided. The linear scale head 62 incorporates a light source for delivering light to the pattern 61b on the linear scale 61, a grating through which the light from the light source passes, a light-receiving device for detecting light reflected from the pattern 61b on the linear scale 61, and a signal processing unit for processing a signal input from the light-receiving device. Light emitted from the light source passes through the grating and undergoes reflection at the pattern 61b on the linear scale 61 to generate an interference fringe on, for example, a photodiode serving as the light-receiving device. When the linear scale 61 moves relatively to the linear scale head 62 in the longitudinal direction of the pattern 61b, the interference fringe also moves and thereby the light-receiving device outputs a sine-wave signal with a period equal to or half the pitch L of the pattern 61b. The sine-wave signal is a biphasic sine wave with 90-degree mutually shifted phases. The linear scale head 62 instructs the signal processing unit to output an amount of relative movement of the linear scale 61 to the linear scale head 62 based on the output difference of the biphasic sine wave. The detection accuracy of the amount of movement is about 1 nm if the pitch L of the pattern 61b is several micrometers, for example.

Figure 4:
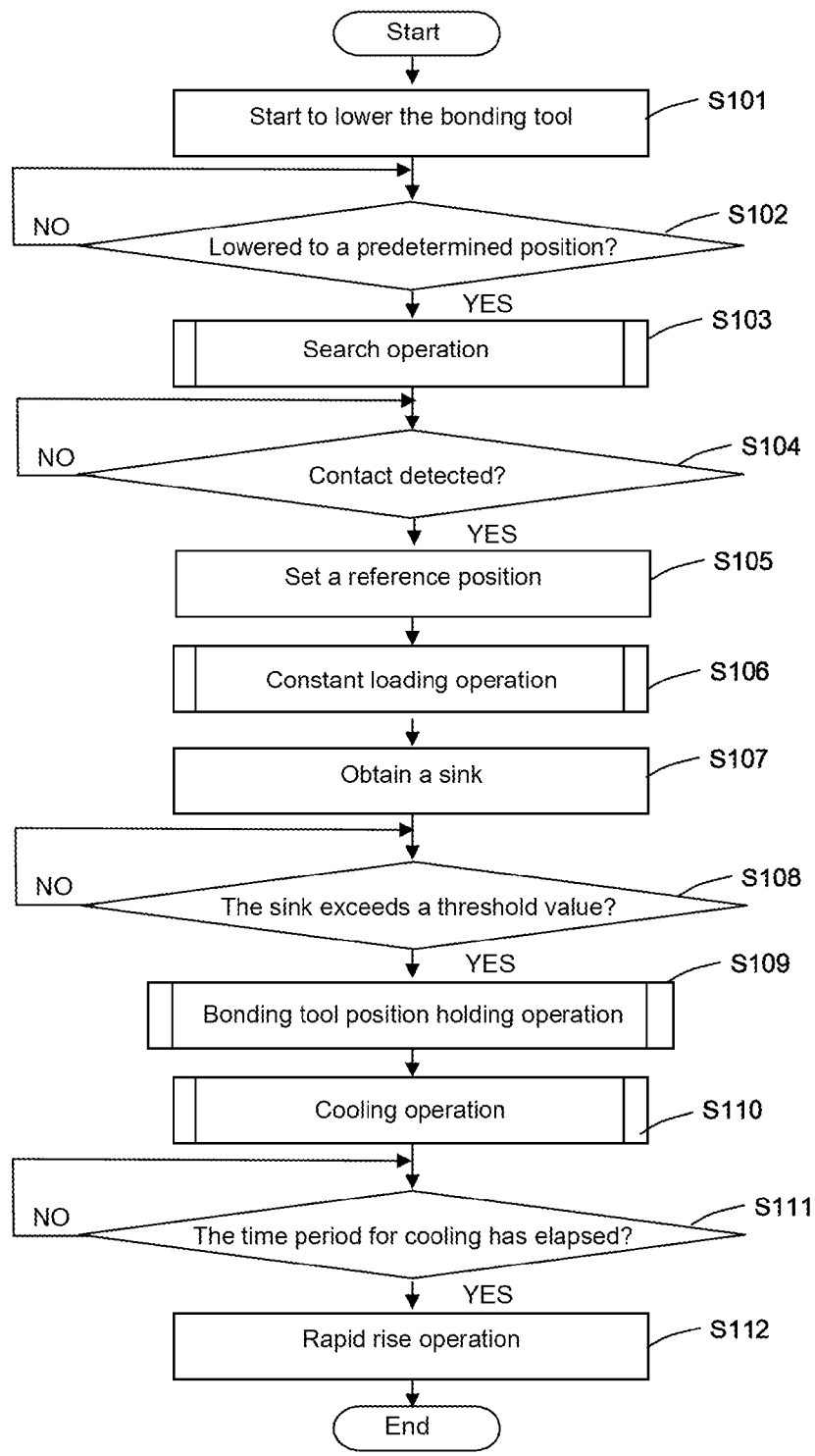
FIG. 4 is a flowchart showing an operation of the electronic component mounting apparatus according to the exemplary embodiment of the present invention.
Figure 5:
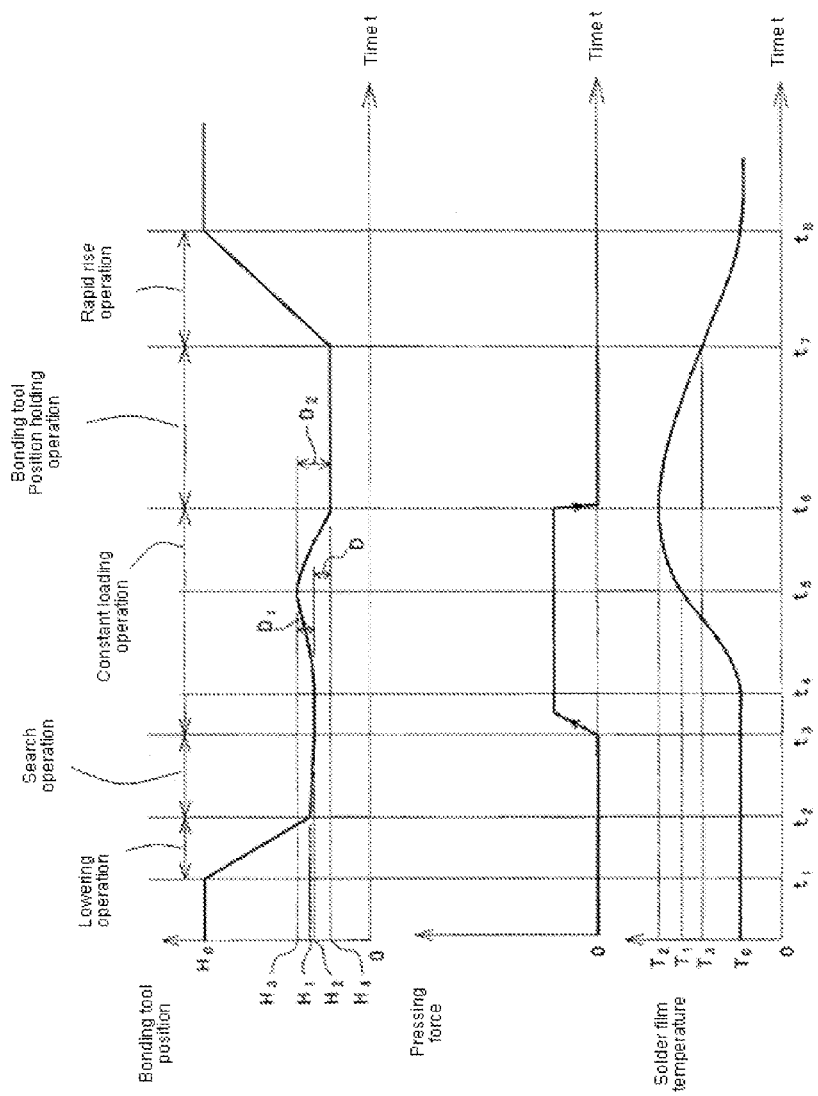
FIG. 5 is an illustrative view showing the change in the position of a bonding tool, the pressing force, and the temperature of a solder layer during an operation of the electronic component mounting apparatus according to the exemplary embodiment of the present invention.
Figure 6:
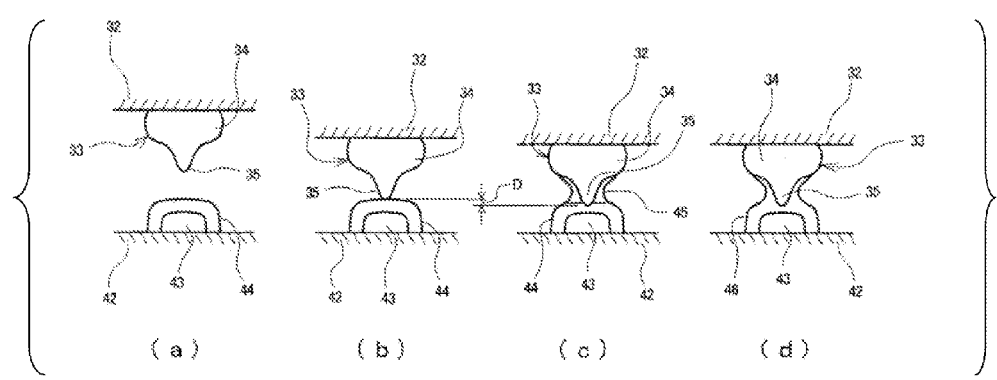
FIG. 6 is an illustrative view showing a process of gold-solder fusion bond between a gold bump and a solder film performed by the electronic component mounting apparatus according to the exemplary embodiment of the present invention.

With reference to FIGS. 4 to 6, a bonding operation will be described of bonding the electronic component 31 to the substrate 42 shown in FIG. 2 using the thus configured electronic component mounting apparatus 100. It is here noted that the electronic component includes a semiconductor chip, a transistor, and a diode. After the alignment of the electrodes 32 of the electronic component 31 with respect to the copper electrodes 43 of the substrate 42 is completed as shown in FIG. 2, the control unit 50 starts a lowering operation of lowering the bonding tool from an initial height $H_0$ as shown in step S101 of FIG. 4 and the time interval from $t_1$ to $t_2$ of FIG. 5. This lowering operation is performed by rotating the motor 13 shown in FIG. 1 and thereby turning the feed screw 18 so that the rise-and-fall block 15 with the nut 17 into which the feed screw 18 is being screwed fixed therein moves downward. The control unit 50 detects a lowered position based on the angle of rotation of the motor 13 and, as shown in step S102 of FIG. 4, determines whether or not the bonding tool is lowered to a predetermined height $H_1$ shown in FIG. 5. When the bonding tool is lowered to the height $H_1$, the gold bump 33 comes very close to the solder film 44 and the copper electrode 43 as shown in FIG. 6 (a), yet there is still a gap between the convex portion 35 of the gold bump 33 and the solder film 44. In this lowering operation, since the voice coil motor 20, the rod 26, and the bonding tool 28 are lowered as one, there occurs no height difference between the linear scale 61 fixed to the rod 26 and the casing 21 of the voice coil motor 20 and the detection signal from the linear scale head 62 remains unchanged from an initial output.

In addition, the control unit 50, if determines that the bonding tool is lowered to the predetermined height $H_1$, stops the motor 13 and therefore the lowering operation and then, as shown in step S103 of FIG. 4, starts a search operation of detecting a position where the leading end of the gold bump 33 shown in FIG. 2 comes into contact with the solder film 44 on the copper electrode 43 of the substrate 42. In this search operation, the bonding tool 28 is lowered slowly until the leading end of the convex portion 35 of the gold bump 33 comes into contact with the surface of the solder film 44 as shown in the time interval from $t_2$ to $t_3$ of FIG. 5. This operation is performed by, for example, changing the current through the coil 23 of the voice coil motor 20 as follows.

When the control unit 50 outputs a command for position lowering during the search operation, the power source 19 applies a current to the coil 23 of the voice coil motor 20 based on the command value for position lowering. Accordingly, the coil 23 moves downward, so that the leading end 24 of the coil comes into contact with the upper end of the rod 26. Since the rod 26 is attached to the casing 21 via the plate spring 25, when an increased current flows through the coil 23 to result in that the leading end 24 of the coil 23 presses down the rod 26 and the plate spring 25 undergoes a deflection according to the pressing force, the rod 26 moves downward and thereby the leading end of the bonding tool 28 is lowered slowly. When the rod 26 moves downward, there occurs a relative height difference between the linear scale 61 fixed to the rod 26 and the casing 21 of the voice coil motor 20, which causes the linear scale head 62 to detect the amount of movement of the linear scale 61. The control unit 50 obtains the lowered position of the bonding tool 28 based on the change in the signal detected by the linear scale head 62 and feeds back the command value for position lowering to adjust the current output from the power source. The control unit 50 can thus perform a search operation of gradually increasing the current through the coil 23 to lower the leading end of the bonding tool 28 slowly.

During the search operation, the control unit 50 uses contact detecting means to monitor if the leading end of the convex portion 35 of the gold bump 33 is in contact with the surface of the solder film 44 as shown in step S104 of FIG. 4. When the leading end of the convex portion 35 of the gold bump 33 comes into contact with the solder film 44, the coil 23 stops moving downward and there starts to appear a difference between the lowered position detected by the linear scale head 62 and the command value for position lowering during the search operation. When the difference between the command value for position lowering and the lowered position detected by the linear scale head 62 exceeds a predetermined threshold value, the control unit 50 determines that the leading end of the convex portion 35 of the gold bump 33 comes into contact with the solder film 44

(contact detecting step). It is noted that since the vertical position of the linear scale 61 is adjusted such that the longitudinal center of the pattern 61b comes directly in front of the linear scale head 62 when the leading end of the convex portion 35 of the gold bump 33 comes into contact with the solder film 44, the linear scale head 62 can measure the amount of vertical movement centering on the point at which the leading end of the convex portion 35 of the gold bump 33 comes into contact with the solder film 44.

The control unit 50, if determines that the leading end of the convex portion 35 of the gold bump 33 comes into contact with the solder film 44, determines that the bonding tool 28 reaches a reference height $H_2$ and sets the height $H_2$ detected by the linear scale head 62 as a reference height (reference position) of the bonding tool 28 as shown in step S105 of FIG. 4 and the time $t_3$ of FIG. 5 (reference position setting step). FIG. 6 (b) shows a state where the leading end of the convex portion 35 of the gold bump 33 comes into contact with the solder film 44.

After setting the reference height, the control unit 50 performs a constant loading operation in which the bonding tool 28 presses down the substrate 42 at a constant pressing force as shown in step S106 of FIG. 4. In this operation, an approximately constant current can flow through the coil 23 of the voice coil motor 20, for example, so that the leading end 24 of the coil 23 presses down the rod 26 at a constant force. Alternatively, a sensor for detecting a pressing force at which the bonding tool 28 presses down the substrate 42 can be provided and the current through the coil 23 can be controlled to change such that the pressing force detected by the sensor represents a constant value, as mentioned above. As shown in step S107 of FIG. 4, the control unit 50 takes difference between the amount of vertical movement detected by the linear scale head 62 and the reference height $H_2$ to calculate the distance by which the bonding tool 28 comes close to the substrate 42 from the height $H_2$ (reference height) when the leading end of the convex portion 35 of the gold bump 33 comes into contact with the solder film 44, that is, the distance of downward movement from the reference height $H_2$ as a sink D. The control unit 50 then starts to monitor if the sink D exceeds a predetermined threshold value as shown in step S108 of FIG. 4.

Since the leading end of the convex portion 35 of the gold bump 33 is not in contact with the solder film 44 in the time interval from $t_1$ to $t_3$ of FIG. 5, the solder film 44 is heated by the stage heater 48 shown in FIG. 1 to have the same temperature $T_0$ as the substrate 42. In contrast, the electronic component 31 is heated to a high temperature by the ceramic heater 27 disposed on the bonding tool 28. Accordingly, when the leading end of the convex portion 35 of the gold bump 33 comes into contact with the solder film 44 at the time $t_3$ of FIG. 5, heat starts to transfer from the leading end of the convex portion 35 of the gold bump 33 to the solder film 44. The temperature of the solder film 44 then starts to rise at the time $t_4$ of FIG. 5. As the temperature of the solder film 44 rises in the time interval from $t_4$ to $t_5$ of FIG. 5, the temperature of the copper electrode 43 also rises accordingly to result in that the copper electrode 43 and the solder film 44 undergo thermal expansion. Since the pressing force is constant during this time interval, the bonding tool 28 is raised gradually from the reference height $H_2$ when the leading end of the gold bump 33 comes into contact with the solder film 44, and finally reaches a height $H_3$ at the time $t_5$. At this time, the bonding tool 28 is positioned at the height $H_3$, which is greater than the reference height $H_2$, so that the amount of downward movement $D_1$ (=$H_2$–$H_3$) from the reference height $H_2$ is negative as shown in FIG. 5, that is, the sink D does not exceed the predetermined threshold value.

At the time $t_5$ of FIG. 5, when the solder film 44 is heated to a temperature $T_1$ at which the solder is fused, the solder film 44 starts to be fused. In this case, the bonding tool 28 is controlled to have a constant pressing force, which causes the convex portion 35 of the gold bump 33 to sink into the fused solder film 44 as shown in FIG. 6 (c). That is, the height of the bonding tool 28 changes from increasing to decreasing at the time $t_5$ and height $H_3$ shown in FIG. 5. The lowered convex portion 35 is then surrounded by the fused solder 45. As the leading end of the convex portion 35 of the gold bump 33 thus sinks into the solder film 44, the height of the bonding tool 28 is made lower than the reference height $H_2$, that is, the sink D, the amount of downward movement from the reference height $H_2$, becomes positive. When the bonding tool is lowered to a height $H_4$ and the sink D (=$H_2$–$H_4$) becomes a predetermined value at the time $t_6$ of FIG. 5, the solder film 44 exists at a thickness of several micrometers between the leading end of the convex portion 35 of the gold bump 33 and the copper electrode 43 of the substrate 42 as shown in FIG. 6 (c). When the sink D exceeds a predetermined threshold value, the control unit 50 stops the constant loading control based on the determination that the solder film 44 is thermally fused and then starts a bonding tool position holding operation of holding the height $H_4$ of the bonding tool 28 at the time $t_6$ as shown in step S109 of FIG. 4.

In this operation, for example, the current through the coil 23 of the voice coil motor 20 can be changed by the difference between the amount of vertical movement detected by the linear scale head 62, so that the bonding tool 28 is at the height $H_4$ and the reference height $H_2$ becomes equal to or smaller than a predetermined threshold value. Since the solder film 44 has a thickness of 10 to 30 μm, measuring and controlling the vertical position of the bonding tool 28 using the linear scale head 62 in the order of about 1 nm allows the solder film 44 to exist stably at a thickness of several micrometers between the leading end of the convex portion 35 of the gold bump 33 and the copper electrode 43 of the substrate 42 as shown in FIG. 6 (c).

The control unit 50 starts a cooling operation, as shown in step S110 of FIG. 4, at the start of the bonding tool position holding operation. In this cooling operation, the ceramic heater 27 heating the bonding tool 28 is turned off and cooled with supplied cooling air, for example, to cool the bonding tool 28 and the electronic component 31 sucked at the leading end thereof together with the ceramic heater 27. This causes the solder 45 to be cooled while the solder film 44 still exists stably at a thickness of several micrometers between the leading end of the convex portion 35 of the gold bump 33 and the copper electrode 43 of the substrate 42 as shown in FIG. 6 (c). At the time $t_7$ of FIG. 5, when the solder film 44 is cooled to a temperature $T_3$ at which the solder is solidified, the solder 45 starts to be solidified to be bond metal 46 with the solder film 44 existing at a thickness of several micrometers between the leading end of the convex portion 35 of the gold bump 33 and the copper electrode of the substrate 42 as shown in FIG. 6 (d). After a predetermined period of time has elapsed, the control unit 50 determines that the cooling operation is completed as shown in step S111 of FIG. 4 and releases the electronic component 31 sucked on the bonding tool 28, and then raises the bonding tool 28 to the initial height $H_0$ by rotating the motor 13 and thereby turning the feed screw 18 as shown in step S112 of FIG. 4 to complete the bonding of the electronic component 31.

As described heretofore, since the electronic component mounting apparatus 100 of this exemplary embodiment transits from the constant loading control to the bonding tool position holding control by determining that the solder film 44 is fused based on the sink D of the bonding tool 28, the bonding tool 28 can be held at a height after a small sink D due to solder fusion. This allows the solder to be solidified and the electronic component 31 to be mounted with the leading end of the convex portion 35 of the gold bump 33 existing within the thin solder film 44 without being in contact with the copper electrode 43 of the substrate 42. It is thus possible to prevent the convex portion 35 of the gold bump 33 from coming into contact with the copper electrode 43, whereby it is also possible to prevent the gold bump 33 from being deformed to come into fault contact with an adjacent gold bump 33 and the electronic component from being damaged through contact loading, resulting in an improvement in the bonding quality.

Although the exemplary embodiment above describes the case of setting the height when the leading end of the convex portion 35 of the gold bump 33 comes into contact with the solder film 44 as a reference height $H_2$ of the bonding tool 28, the height $H_3$ at the time $t_5$ of FIG. 5 that the height of the bonding tool 28 changes from increasing to decreasing after the leading end of the convex portion 35 of the gold bump 33 comes into contact with the solder film 44 can be set as a second reference height (second reference position setting step). In this case, the control is switched from constant loading to bonding tool position holding when the sink becomes $D_2=H_3-H_4$ as shown in FIG. 5, as is the case in the above-described exemplary embodiment (second bonding tool position holding operation). This offers the same advantage as the above-described exemplary embodiment.

The present invention is not limited to the above-described exemplary embodiment, and various variations and modifications can be made without departing from the technical scope and nature of the invention defined in the appended claims.

DESCRIPTION OF REFERENCE NUMERALS

10 Base
11 Frame
12 Upper flange
13 Motor
14 Guide
15 Rise-and-fall block
16 Slider
17 Nut
18 Feed screw
19 Power source
20 Voice coil motor
21 Casing
22 Stator
23 Coil
24 Leading end
25 Plate spring
26 Rod
27 Ceramic heater
28 Bonding tool
31 Electronic component
32 Electrode
33 Gold bump
34 Base portion
35 Convex portion
41 Bonding stage
42 Substrate
43 Copper electrode
44 Solder film
45 Solder
46 Bond metal
48 Stage heater
50 Control unit
51 CPU
52 Memory
53 Bonding program
54 Reference position setting program
55 Bonding tool position holding program
56 Second reference position setting program
57 Second bonding tool position holding program
58 Control data
59 Contact detecting program
61 Linear scale
61a Linear scale main body
61b Pattern
62 Linear scale head
100 Electronic component mounting apparatus

The invention claimed is:

1. A method of mounting an electronic component on a substrate using a mounting apparatus, the method comprising:
preparing an apparatus comprising:
a rise-and-fall block;
a first drive unit driving the rise-and-fall block along a path toward and away from the substrate in a gross movement;
a bonding tool for thermally bonding a bump on an electrode of the electronic component and the substrate with a thermally fused bond metal;
a second drive unit driving the bonding tool along the path toward and away from the substrate in a fine movement, the second drive unit incorporated in the rise-and-fall block and comprising a voice coil motor;
a position detection unit for detecting a position of the bonding tool on the path, the position detection unit issuing a detection signal when the bump and a film of the bond metal are in contact with each other; and
a control unit for controlling the bonding tool on the path with the first drive unit and the second drive unit;
moving the bonding tool toward the substrate with the first drive unit and then moving the bonding tool further toward the substrate with the second drive unit while determining with the position detection unit whether or not the bump and the film are in contact with each other based on the detection signal;
setting the position of the bonding tool with respect to the substrate as a first reference position when it is determined in the step of determining that the bump and the film are in contact with each other; and
bringing the bonding tool close to the substrate from the first reference position while heating the electronic component by controlling the second drive unit so as to provide a constant pressing force with which the bonding tool presses down the substrate and holding the position of the bonding tool along said path with the second drive unit based on the determination that bond metal between an electrode of the electronic component and an electrode of the substrate is thermally fused when the electronic component gets close to the substrate from the first reference position by a predetermined distance smaller than the thickness of a film of the bond metal.

2. The electronic component mounting method according to claim 1, further comprising:

setting the position of the bonding tool with respect to the substrate as a second reference position after the first reference position is set in the step of setting and when the distance of the bonding tool from the substrate along said path changes from increasing to decreasing; and bringing the bonding tool close to the substrate from the second reference position while heating the electronic component by controlling the second drive unit so as to provide a constant pressing force with which the bonding tool presses down the substrate and holding the position of the bonding tool along said path with the second drive unit based on the determination that the bond metal between the electrode of the electronic component and the electrode of the substrate is thermally fused when the electronic component gets close to the substrate from the second reference position by a second predetermined distance that adds the predetermined distance to the difference between the second reference position and the first reference position.

* * * * *